United States Patent
Gotou et al.

(10) Patent No.: US 8,039,074 B2
(45) Date of Patent: Oct. 18, 2011

(54) PROTECTIVE FILM FOR TEMPORARILY LAMINATION TO ELECTROMAGNETIC WAVE SHIELDING SHEET, METHOD FOR PRODUCING THE SAME, AND ELECTROMAGNETIC WAVE SHIELDING SHEET

(75) Inventors: Akiko Gotou, Tokyo-to (JP); Hironori Kamiyama, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 0 days.

(21) Appl. No.: 12/796,117

(22) Filed: Jun. 8, 2010

(65) Prior Publication Data

US 2010/0247877 A1    Sep. 30, 2010

Related U.S. Application Data

(62) Division of application No. 11/768,309, filed on Jun. 26, 2007, now abandoned.

(30) Foreign Application Priority Data

Jun. 29, 2006  (JP) .................... 2006-179105

(51) Int. Cl.
 B32B 9/00   (2006.01)
 B32B 33/00  (2006.01)

(52) U.S. Cl. .................. 428/40.1; 428/41.5; 428/41.7

(58) Field of Classification Search ............. 428/40.1, 428/41.5, 42.2, 42.3, 41.7
See application file for complete search history.

(56) References Cited

U.S. PATENT DOCUMENTS

| | | | |
|---|---|---|---|
| 6,417,619 B1* | 7/2002 | Yasunori et al. | 313/582 |
| 6,706,355 B2 | 3/2004 | Holguin et al. | |
| 2003/0142486 A1* | 7/2003 | Arakawa et al. | 361/818 |
| 2008/0200333 A1 | 8/2008 | Gotou et al. | |

FOREIGN PATENT DOCUMENTS

JP  11-26024 A    5/1999
JP  2003-188576 A  7/2003

OTHER PUBLICATIONS

USPTO OA mailed Dec. 29, 2009 for Parent U.S. Appl. No. 11/768,309.
USPTO OA mailed Mar. 9, 2010 for Parent U.S. Appl. No. 11/768,309.

* cited by examiner

Primary Examiner — Patricia Nordmeyer
(74) Attorney, Agent, or Firm — Ladas & Parry LLP

(57) ABSTRACT

An electromagnetic wave shielding sheet with a protective film that is temporarily laminated on a copper mesh layer for shielding electromagnetic waves is disclosed. The electromagnetic wave shielding sheet includes a transparent substrate, at least a copper mesh layer provided on one surface of the transparent substrate and a protective film temporarily laminated to the copper-mesh-layer-side surface. The protective film includes a support and an adhesive layer containing a polymer having repeating units derived from an acrylic ester and/or a methacrylic ester on the support.

12 Claims, 6 Drawing Sheets

PROTECTIVE FILM FOR TEMPORARILY LAMINATION TO ELECTROMAGNETIC WAVE SHIELDING SHEET, METHOD FOR PRODUCING THE SAME, AND ELECTROMAGNETIC WAVE SHIELDING SHEET

This application is a divisional of application Ser. No. 11/768,309 filed Jun. 26, 2007, now abandoned.

BACKGROUND OF THE INVENTION

1. Field of the Invention

The present invention relates to an electromagnetic wave shielding sheet to shield electromagnetic waves produced from displays such as cathode-ray tubes (CRT) or plasma display panels (PDP.) In particular, the present invention relates to a protective film that causes no discoloration of an electromagnetic wave shielding sheet even after long-term storage at high temperature and high humidity, a method for producing the protective film, and an electromagnetic wave shielding sheet with the protective film.

2. Description of the Related Art

With the sophistication of function and the increasing use of electrical and electronic devices in recent years, electromagnetic interference (ERI) has increased and displays such as cathode-ray tubes and plasma display panels produce electromagnetic waves. To shield the electromagnetic waves, electromagnetic wave shielding sheets to be disposed on the front face of a display is known. Such electromagnetic wave shielding sheets are demanded to have optical transparency as well as electromagnetic wave shielding capability. Accordingly, electromagnetic wave shielding sheets provided with optical transparency by using a transparent substrate such as a resin film or a glass plate as a substrate and forming thereon a conductive mesh layer of metal such as copper are known.

Sometimes optical filters such as an antireflection filter and a near-infrared filter are mounted on the front face of a display so that in many cases an electromagnetic wave shielding sheet is laminated to the optical filters through an adhesive layer and disposed on the front surface of a display as a composite filter. For example, Japanese Patent Application Laid-Open (JP-A) No. 11-126024 discloses a front surface plate of a display panel in which an antireflection film is attached to a filter film for shielding electromagnetic waves through a tacky adhesive layer.

Sometimes a protective film is temporarily laminated to the electromagnetic wave shielding sheet to protect the mesh layer until the electromagnetic wave shielding sheet is disposed on the front face of a display or laminated to other optical filters, etc. JP-A No. 2003-188576 discloses an electromagnetic wave shield sheet comprising a protective film to protect a transparent base film or an electromagnetic wave shielding layer in handling or production of the products.

SUMMARY OF THE INVENTION

As aforementioned, during the time between forming a conductive mesh layer on a transparent substrate and treating the mesh layer surface with various post-processes such as providing an adhesive layer that will function as a planarizing layer of the mesh layer and laminating the adhesive layer to another optical film or a display, preferably a protect film is temporarily laminated to the mesh layer surface to keep the concave of the conductive mesh layer free of dust or to make mesh lines of the conductive mesh layer having an extremely narrow width of about 10 μm free from contamination or breaking. In order to laminate a protective film directly to such a mesh layer surface, the protective film is required to have appropriate adhesion properties that allow the protective film to directly adhere to and easily peel off the conductive mesh layer, and use of a film having an adhesive layer has been studied. However, at the time of peeling off a protective film, some adhesives cause problems such that a blackened layer that is further laminated on a copper mesh layer is partially peeled off together with the protective film and adhesive residue is left behind. In the case where a film having an adhesive layer is temporarily laminated to a conductive mesh layer such as a copper mesh layer, some adhesives cause a problem of blue-green discoloration of the copper mesh layer when the electromagnetic wave shielding sheet is stored for a long time, especially at high temperature and high humidity. Such discoloration of a copper mesh layer causes blue discoloration of the electromagnetic wave shielding sheet and the color reproducibility of a display is adversely affected. This problem also occurs when a blackened layer comprising a thin film of cooper-cobalt alloy particles, nickel sulfide particles or the like is formed on a copper mesh and an adhesive layer is laminated thereon.

The present invention has been achieved in light of the above-stated problems. The object of the present invention is firstly to provide a protective film for temporary lamination to an electromagnetic wave shielding sheet, which film leaves no adhesive residue behind when peeled off and causes no partial peeling of a blackened layer and the like if the blackened layer and the like are further laminated on the copper mesh layer, while the film having appropriate adhesion properties that involves easy adhesion and easy peelability in a balanced manner with respect to a copper mesh layer of the electromagnetic wave shielding sheet. Especially, the present invention is to provide a protective film for temporary lamination to an electromagnetic wave shielding sheet that causes no discoloration of the electromagnetic wave shielding sheet even after long-term use, especially at high temperature and high humidity.

The object of the present invention is secondly to provide an electromagnetic wave shielding sheet with a protective film that is temporarily laminated on a copper mesh layer for shielding electromagnetic waves, the protective film leaves no adhesive residue behind when peeled off and causes no partial peeling of a blackened layer and the like if the blackened layer and the like are further laminated on the copper mesh layer, while the copper mesh layer and the protective film exhibit easy adhesion and easy peelability. Especially, the present invention is to provide an electromagnetic wave shielding sheet that does not discolor even after long-term use, especially at high temperature and high humidity.

In order to achieve the first object, the present invention provides a protective film for temporary lamination to an electromagnetic wave shielding sheet in which at least a copper mesh layer is provided on one surface of a transparent substrate, wherein the protective film is for temporary lamination to a copper-mesh-layer-side surface of the electromagnetic wave shielding sheet; the protective film comprises a support and an adhesive layer containing a polymer having repeating units derived from an acrylic ester and/or a methacrylic ester on the support; and an amount of free organic acids in the adhesive layer is an amount that makes 10 or less a color difference $\Delta E_{L^*a^*b^*}$ of the copper-mesh-layer-side surface of the electromagnetic wave shielding sheet before and after the adhesive layer surface is laminated on the copper-mesh-layer-side surface and they are left for 200 hours in an atmosphere of a temperature of 60° C. and a relative humidity of 95%.

In order to achieve the first object, the present invention also provides a protective film for temporary lamination to an electromagnetic wave shielding sheet, wherein the protective film comprises a support and an adhesive layer containing a polymer having repeating units derived from an acrylic ester and/or a methacrylic ester on the support; and 20 ng/cm$^2$ or less is a total amount of acetic acid and formic acid extracted upon testing the protective film by a test method in which the adhesive layer surface of the protective film is extracted at 23° C. for 15 minutes with ultrapure water and the resulting extract is measured for an amount of extracted acetic acid and an amount of extracted formic acid by ion chromatography.

In order to achieve the first object, the present invention further provides a protective film for temporary lamination to an electromagnetic wave shielding sheet, wherein the protective film comprises a support and an adhesive layer containing a polymer having repeating units derived from urethane acrylate and/or urethane methacrylate on the support.

Further, the present invention provides a method for producing a protective film for temporary lamination to a copper-mesh-layer-side surface of an electromagnetic wave shielding sheet in which at least the copper mesh layer is provided on one surface of a transparent substrate, the method comprising the steps of: selecting an adhesive in which an amount of free organic acids is an amount that makes 10 or less a color difference $\Delta E_{L^*a^*b^*}$ of the copper-mesh-layer-side surface of the electromagnetic wave shielding sheet before and after the adhesive is laminated on the copper-mesh-layer-side surface and they are left for 200 hours in an atmosphere of a temperature of 60° C. and a relative humidity of 95%, from adhesives containing a polymer having repeating units derived from an acrylic ester and/or a methacrylic ester, and therewith forming an adhesive layer on a support.

In order to achieve the second object, the present invention provides an electromagnetic wave shielding sheet comprising: a transparent substrate; at least a copper mesh layer provided on one surface of the transparent substrate; and a protective film temporarily laminated to a copper-mesh-layer-side surface, wherein the protective film comprises a support and an adhesive layer containing a polymer having repeating units derived from an acrylic ester and/or a methacrylic ester on the copper mesh layer side of the support, and an amount of free organic acids in the adhesive layer is an amount that makes 10 or less a color difference $\Delta E_{L^*a^*b^*}$ of the copper-mesh-layer-side surface of the electromagnetic wave shielding sheet before and after the adhesive layer surface is laminated on the copper-mesh-layer-side surface and they are left for 200 hours in an atmosphere of a temperature of 60° C. and a relative humidity of 95%.

Also, in order to attain the second object, the present invention provides an electromagnetic wave shielding sheet comprising: a transparent substrate; at least a copper mesh layer provided on one surface of the transparent substrate; and a protective film temporarily laminated to a copper-mesh-layer-side surface, wherein the protective film comprises a support and an adhesive layer containing a polymer having repeating units derived from an acrylic ester and/or a methacrylic ester on the copper mesh layer side of the support; the protective film is temporarily laminated to the copper-mesh-layer-side surface through the adhesive layer; and 20 ng/cm$^2$ or less is a total amount of acetic acid and formic acid extracted upon testing the protective film by a test method in which the adhesive layer surface of the protective film is extracted at 23° C. for 15 minutes with ultrapure water and the resulting extract is measured for an amount of extracted acetic acid and an amount of extracted formic acid by ion chromatography.

In order to attain the second object, the present invention also provides an electromagnetic wave shielding sheet comprising: a transparent substrate; at least a copper mesh layer provided on one surface of a transparent substrate; and a protective film temporarily laminated to a copper-mesh-layer-side surface, wherein the protective film comprises a support and an adhesive layer containing a polymer having repeating units derived from urethane acrylate and/or urethane methacrylate on the copper mesh layer side of the support.

According to the present invention, since the protective film comprises an adhesive layer containing a polymer having repeating units derived from an acrylic ester and/or a methacrylic ester, and the amount of free organic acids in the adhesive layer is an amount that makes 10 or less a color difference $\Delta E_{L^*a^*b^*}$ of the copper-mesh-layer-side surface of the electromagnetic wave shielding sheet before and after the adhesive layer surface is laminated on the copper-mesh-layer-side surface and they are left for 200 hours in an atmosphere of a temperature of 60° C. and a relative humidity of 95%, the following effects can be produced. While the copper mesh layer and the protective film appropriately exhibit easy adhesion and easy peelability, the protective film leaves no adhesive residue behind when peeled off and causes no partial peeling of a blackened layer and the like that are further laminated on the copper mesh layer. In addition, the protective film causes no discoloration of the copper mesh layer even after long-term use, especially at high temperature and high humidity.

According to the present invention, since the protective film comprises an adhesive layer containing a polymer having repeating units derived from an acrylic ester and/or a methacrylic ester, and 20 ng/cm$^2$ or less is the total amount of acetic acid and formic acid extracted upon testing the protective film by the above-specified test method, the following effects can be produced. While the copper mesh layer and the protective film appropriately exhibit easy adhesion and easy peelability, the protective film leaves no adhesive residue behind when peeled off and causes no partial peeling of a blackened layer and the like that are further laminated on the copper mesh layer. In addition, the protective film causes no discoloration of the copper mesh layer even after long-term use, especially at high temperature and high humidity.

In the present invention, since the protective film comprises an adhesive layer containing a polymer having repeating units derived from urethane acrylate and/or urethane methacrylate, the following effects can be produced. While the copper mesh layer and the protective film exhibit easy adhesion and easy peelability, the protective film leaves no adhesive residue behind when peeled off and causes no partial peeling of a blackened layer and the like that are further laminated on the copper mesh layer.

In the electromagnetic wave shielding sheet of the present invention, delamination resistance of the adhesive layer of the protective film is preferably from 0.05 to 1.3 N/25 mm with respect to the copper-mesh-layer-side surface from the viewpoint of appropriate adhesion that allows the protective film to directly adhere to and easily peel off the copper mesh layer.

In the electromagnetic wave shielding sheet of the present invention, surface roughness of the copper-mesh-layer-side surface to which the protective film is temporarily laminated is preferably a ten-point average roughness "Rz JIS" (JIS B0601 (1994)) of the profile from 0.5 to 5.0 μm when a roughness profile is used as a profile of the surface, and a center line average roughness "Ra" (JIS B0601 (1994)) of fine irregularities on the surface from 0.1 to 3.0 μm from the viewpoint of appropriate adhesion and removability when combined with an adhesive specified in the present invention, that is, the protective film leaves no adhesive residue behind when peeled off and causes no partial peeling of a blackened layer and the like if the blackened layer and the like are further laminated on the copper mesh layer, while having easy adhesion and easy peelability.

BRIEF DESCRIPTION OF THE DRAWINGS

In the accompanying drawings.

Figure 1:
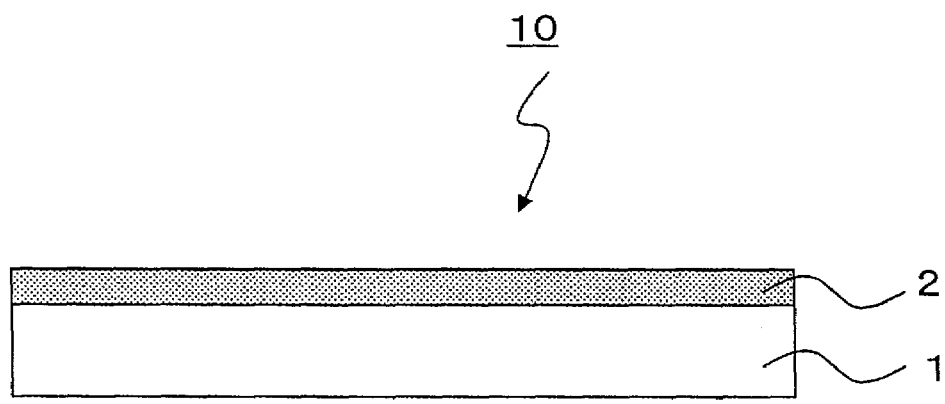
FIG. 1 is a sectional view illustrating an example of a protective film for temporary lamination to an electromagnetic wave shielding sheet according to the present invention.

The numerical symbol in each figure refers to the following: 1. support; 2. adhesive layer; 11. transparent substrate; 12. conductor layer; 13. conductive treating layer; 14. copper mesh layer; 15. copper plated layer; 17. blackened layer; 18. metal layer; 20, 30, 40. laminate; 21. first paper feed member; 22. second paper feed member; 23. first release film wind-up roller; 24. second release film wind-up roller; 25. first laminating unit; 26. second laminating unit; 27. wind-up roller; 100. electromagnetic wave shielding sheet; 101. mesh area; 103. opening; and 104. line

DESCRIPTION OF THE PREFERRED EMBODIMENT

The present invention relates to a protective film for temporary lamination to an electromagnetic wave shielding sheet and an electromagnetic wave shielding sheet. Hereinafter, a protective film for temporary lamination to an electromagnetic wave shielding sheet and an electromagnetic wave shielding sheet will be described in this order.

A. Protective film for temporary lamination to electromagnetic wave shielding sheet Now, the protective film for temporary lamination to the electromagnetic wave shielding sheet of the present invention is described.

The first protective film for temporary lamination to an electromagnetic wave shielding sheet of the present invention is a protective film for temporary lamination to an electromagnetic wave shielding sheet in which at least a copper mesh layer is provided on one surface of a transparent substrate, wherein the protective film is for temporary lamination to a copper-mesh-layer-side surface of the electromagnetic wave shielding sheet; the protective film comprises a support and an adhesive layer containing a polymer having repeating units derived from an acrylic ester and/or a methacrylic ester on the support; and an amount of free organic acids in the adhesive layer is an amount that makes 10 or less a color difference $\Delta E_{L^*a^*b^*}$ of the copper-mesh-layer-side surface of the electromagnetic wave shielding sheet before and after the adhesive layer surface is laminated on the copper-mesh-layer-side surface and they are left for 200 hours in an atmosphere of a temperature of 60° C. and a relative humidity of 95%.

The second protective film for temporary lamination to an electromagnetic wave shielding sheet of the present invention is a protective film for temporary lamination to an electromagnetic wave shielding sheet, wherein the protective film comprises a support and an adhesive layer containing a polymer having repeating units derived from an acrylic ester and/or a methacrylic ester on the support, and 20 ng/cm$^2$ or less is a total amount of acetic acid and formic acid extracted upon testing the protective film by a test method in which the adhesive layer surface of the protective film is extracted at 23° C. for 15 minutes with ultrapure water and the resulting extract is measured for an amount of extracted acetic acid and an amount of extracted formic acid by ion chromatography.

The third protective film for temporary lamination to an electromagnetic wave shielding sheet is a protective film for temporary lamination to an electromagnetic wave shielding sheet, wherein the protective film comprises a support and an adhesive layer containing a polymer having repeating units derived from urethane acrylate and/or urethane methacrylate on the support.

Temporarily laminating a temporary protective film to the copper mesh layer surface of the electromagnetic wave shielding sheet has advantages such that during the time until the next process, the concave portion of the conductive mesh layer can be kept free of dust and the mesh lines can be free from breaking or contamination upon handling or storage. In the case of temporarily laminating a film having an adhesive layer to a copper mesh layer, however, some adhesives cause problems such that adhesive residue is left behind when a temporarily laminated protective film is peeled off and a blackened layer and the like that are further laminated on the copper mesh layer are partially peeled off together with the protective film. Another problem is that the copper mesh layer discolors after the electromagnetic wave shielding sheet is stored for a long time, especially at high temperature and high humidity.

In this regard, since the protective film of the present invention uses an adhesive layer containing a polymer having repeating units derived from an acrylic ester and/or a methacrylic ester, especially a polymer having repeating units derived from urethane acrylate and/or urethane methacrylate for the adhesive to form an adhesive layer, the protective film leaves no adhesive residue behind when peeled off and causes no partial peeling of a blackened layer and the like that are further laminated on the copper mesh layer. In addition, the protective film has good adhesion and removability.

Since the protective film comprises an adhesive layer containing a polymer having repeating units derived from an acrylic ester and/or a methacrylic ester and the amount of free organic acids in the adhesive layer is an amount that makes 10 or less the color difference of the copper-mesh-layer-side surface before and after the above-specified test in a high temperature and high humidity environment, the protective film leaves no adhesive residue behind when peeled off and causes no partial peeling of a blackened layer and the like that are further laminated on the copper mesh layer, while the copper mesh layer and the protective film exhibit appropriate adhesion properties. In addition, the protective film allows no discoloration of the electromagnetic wave shielding sheet even after long-term use, especially at high temperature and high humidity. It is noted the term "free organic acids" refers to organic compounds having a carboxyl group that is present in uncombined form and examples of the free organic acids include acetic acid and formic acid.

Alternatively, since the protective film comprises an adhesive layer containing a polymer having repeating units derived from an acrylic ester and/or a methacrylic ester and 20 ng/cm$^2$ or less is the total amount of acetic acid and formic acid extracted from the adhesive layer surface upon testing the protective film by the above-specified test method, the protective film leaves no adhesive residue behind when peeled off and causes no partial peeling of a blackened layer and the like that are further laminated on the copper mesh layer, while the copper mesh layer and the protective film exhibit appropriate adhesion properties. In addition, the protective film allows no discoloration of the electromagnetic wave shielding sheet even after long-term use, especially at high temperature and high humidity.

The reasons that the copper mesh layer of the electromagnetic wave shielding sheet and the protective film exhibit appropriate adhesion properties and the protective film used in the present invention causes no discoloration of the electromagnetic wave shielding sheet even after long-term use, especially at high temperature and high humidity, are considered as follows.

An adhesive layer containing a polymer having repeating units derived from an acrylic ester and/or a methacrylic ester, especially an adhesive layer containing a polymer having repeating units derived from urethane acrylate and/or urethane methacrylate, is found suitable and selected as one having good adhesion and removability, i.e. one that hardly leaves adhesive residue behind when peeling off a protective film and causes no partial peeling of a blackened layer and the like that are further laminated on the copper mesh layer, while having appropriate adhesion properties that allows the adhesive layer to directly adhere to and easily peel off the conductive mesh layer. On the other hand, discoloration of the copper mesh layer after long-term storage at high temperature and high humidity is attributed to that the presence of protons dissociated from acids and so on and water contained in the adhesive layer renders the copper surface sensitive to oxidation so that compounds containing copper ions such as copper complex is produced by oxidation, thereby discoloring the copper surface to blue or similar color.

It seems that in general carboxyl groups or acid components can be present in an adhesive layer containing a polymer having repeating units derived from an acrylic ester and/or a methacrylic ester.

To the contrary, while the adhesive layer of the protective film of the present invention is an adhesive layer containing a polymer having repeating units derived from an acrylic ester and/or a methacrylic ester, the amount of free organic acids in the adhesive layer is as small as an amount that makes 10 or less the color difference $\Delta E_{L^*a^*b^*}$ of the copper-mesh-layer-side surface before and after the above-specified test in a high temperature and high humidity environment.

Also, while the adhesive layer of the protective film of the present invention is an adhesive layer containing a polymer having repeating units derived from an acrylic ester and/or a methacrylic ester, the total amount of acetic acid and formic acid extracted from the adhesive layer surface in a test conducted by the above-specified test method is as small as 20 ng/cm$^2$ or less.

As aforementioned, among the acid components contained in the adhesive layer, the present invention focuses on free organic acids that are capable of readily transferring to the adhesive layer surface to be in contact with the electromagnetic wave shielding sheet or specific free organic acids that are present on the adhesive layer surface. It is presumed that reducing the amount of the free organic acids allows to decrease the presence of protons dissociated from the adhesive layer surface to be in contact with the electromagnetic wave shielding sheet so as to control the oxidation-sensitive state of the copper surface even in high temperature and high humidity environment. Consequently, it seems possible to obtain an electromagnetic wave shielding sheet that does not discolor even after long-term use, especially at high temperature and high humidity, by using the above-described adhesive layer as an adhesive layer to be in contact with the copper mesh layer surface of the electromagnetic wave shielding sheet.

(Layer Configuration)

FIG. 1 is a sectional view showing a basic embodiment of the protective film for temporary lamination to the electromagnetic wave shielding sheet according to the present invention.

FIG. 1 shows a configuration of a protective film 10 for temporary lamination to an electromagnetic wave shielding sheet, in which an adhesive layer 2 containing a polymer having repeating units derived from an acrylic ester and/or a methacrylic ester is laminated on a support 1.

A release layer (not shown in FIG. 1) may be further laminated on the surface of the support 1, on which the adhesive layer 2 is not laminated. Also, the release layer may be laminated to the adhesive layer 2 until the protective film for temporary lamination to an electromagnetic wave shielding sheet is actually laminated to an electromagnetic wave shielding sheet.

The embodiments of the protective film for temporary lamination to the electromagnetic wave shielding sheet of the present invention are not limited by the above-mentioned examples. Any that has the substantially same essential features as the technical ideas described in claims of the present invention and exerts the same effects and advantages is included in the technical scope of the present invention.

Hereinafter, the protective film of the present invention will be described.

(Support)

The support is a layer having strength to support the adhesive layer having low mechanical strength and to protect the mesh surface of the electromagnetic wave shielding sheet. Consequently, there is no particular limit to the support and as far as it has strength to support the adhesive layer and to protect the mesh surface, and suitable properties for storage. It may be appropriately selected for use depending on storage conditions. Concrete examples of the support include a film or sheet of organic material such as resin. Such film or sheet is suitable for use since it is sufficiently thin, lightweight, flexible and strong.

Resins used to form the film or sheet of organic material include, for example, polyester resin such as polyethylene terephthalate, polybutylene terephthalate, polyethylene naphthalate, copolymer of terephthalic acid, isophthalic acid and ethylene glycol, copolymer of terephthalic acid, cyclohexanedimethanol and ethylene glycol; polyamide resin such as nylon 6; polyolefin resin such as polyethylene, polypropylene, polymethylpentene; polyvinyl chloride; and so on.

There is no particular limit to the thickness of the support as far as it meets the storage conditions of the electromagnetic wave shielding sheet. The thickness is normally from 25 to 70

μm, preferably from 40 to 60 μm. The support having a thickness less than the range is insufficient in mechanical strength and may break. The support having a thickness exceeding the range is excess in performance and expensive. In addition, it is difficult to wind for storage.

A resin film or sheet is a preferable material for the support. Among resins, polyolefins such as polyethylene, polypropylene are particularly preferable since they are excellent in transparency, easy to peel for its balance between elasticity and flexibility, and inexpensive. Especially, polypropylene is preferable since it does not stretch easily and hardly causes curling or partial detachment of the protective film after adhesion. In addition, for these reasons, the selection tolerance of delamination resistance of the adhesive is widened.

(Adhesive Layer)

The adhesive layer provided with the protective film of the present invention needs to have the above-mentioned excellent adhesion and removability. Further, the copper mesh layer surface (especially, a thin and rough or porous blackened layer) to which the protective film will adhere is required not to peel off with the adhesive. As a result of considering various resins, an acrylic polymer, that is, one containing a polymer having repeating units derived from an acrylic ester and/or a methacrylic ester is found excellent. The adhesive layer provided with the protective film of the present invention may contain a compound such as an additive (e.g. antioxidant) as needed. Rubber adhesives are generally excellent to prevent discoloration of copper. However, in this case, since the copper mesh layer surface (especially, the blackened layer) is liable to peel off with the adhesive layer at the time of peeling off the protective film, they are not suitable for the application in which such peeling of the copper mesh layer surface is not desired.

The term "adhesive" as used herein refers to a kind of bonding agent which allows adhesion by simply applying an appropriate, light hand pressure with only surface stickiness given by the bonding agent. In general, the adhesive requires no physical energy or action such as heat, humidity or radiation irradiation (e.g. ultraviolet or electron-beam irradiation) to exhibit its adhesion force. In addition, no chemical reaction such as polymerization reaction is required. The adhesive can keep a certain adhesion force that is capable of adhesion and removability over time. As the adhesive used in the present invention, an acrylic adhesive which mainly comprises repeating units derived from an acrylic ester and/or a methacrylic ester and is a polymer obtained by copolymerizing copolymerizable monomers as needed since the adhesive leaves no adhesive residue behind when peeling off the protective film and causes no partial peeling of a blackened layer and the like that are further laminated on the copper mesh layer, while having appropriate adhesion properties.

In the case where such an acrylic adhesive is used as an adhesive layer, discoloration of a copper mesh layer may easily occur. However, in the adhesive layer provided with the protective film of the present invention, the amount of free organic acids in the adhesive layer is an amount that makes 10 or less the color difference $\Delta E_{L^*a^*b^*}$ of the copper-mesh-layer-side surface, the color difference $\Delta E_{L^*a^*b^*}$ is based on chromaticities a*, b*, and a luminance L* (defined by International Commission on Illumination or CIE) of the copper-mesh-layer-side surface measured before and after the adhesive layer surface is laminated on the copper-mesh-layer-side surface of the electromagnetic wave shielding sheet and left for 200 hours in an atmosphere of a temperature of 60° C. and a relative humidity of 95%. Preferably, the amount of free organic acids in the adhesive layer is an amount that makes the color difference $\Delta E_{L^*a^*b^*}$ 5 or less. More preferably, it is an amount that makes the color difference $\Delta E_{L^*a^*b^*}$ 1 or less. From the viewpoint of ensuring adhesion to the copper mesh layer, a certain amount of free organic acids may remain in the adhesive layer as far as the color difference $\Delta E_{L^*a^*b^*}$ is 10 or less and 0.1 or more. Color difference $\Delta E_{L^*a^*b^*}$ is calculated by the following equation: $\Delta E_{L^*a^*b^*} = \{(\Delta L^*)^2 + (\Delta a^*)^2 + (\Delta b^*)^2\}^{1/2}$ It is noted that $\Delta L^*$, $\Delta a^*$ and $\Delta b^*$ respectively refer to the difference of values of L*, a* and b* of the copper-mesh-side surface of the electromagnetic wave shielding sheet, before and after the sheet is left to stand in the above-specified environment for the above-specified hours. L*, a* and b* are values in L*a*b* color system recommended by the International Commission on Illumination (CIE) in 1976 and also defined in JIS Z8729.

when the copper mesh layer has a color tone of the copper or a color tone of the blackened layer on the copper surface, and the mesh shape and size of the copper mesh layer is in the ranges of those as will be described, a color difference $\Delta E_{L^*a^*b^*}$ of 10 or less is almost invisible and practically unnoticeable in the case of the electromagnetic wave shielding sheet comprising the copper mesh disposed on the front face of a normal image display. Especially, a color difference $\Delta E_{L^*a^*b^*}$ of less than the range of 0.6 to 1.0, which range is generally regarded as the visually differentiable threshold range, is more preferable since no discoloration of the copper mesh layer surface can be visually differentiated.

The adhesive layer to be provided with the protective film of the present invention hardly causes discoloration of the copper mesh layer since an adhesive layer in which the total amount of acetic acid and formic acid obtained by extracting the adhesive layer surface at 23° C. for 15 minutes with ultrapure water measures 20 ng/cm² or less by ion chromatography, is selected as the adhesive layer of the present invention. More particularly, a color difference $\Delta E_{L^*a^*b^*}$ of 10 or less, more preferably 5 or less, still more preferably 1 or less, is achievable in the case where the adhesive layer surface of the protective layer of the present invention is laminated to the copper-mesh-layer-side surface of the electromagnetic wave shielding sheet; a test in a high temperature and high humidity environment is performed thereon (i.e., they are left in an environment with a temperature of 60° C. and a relative humidity of 95% for 200 hours); and chromaticities a*, b*, and a luminance L* (defined by International Commission on Illumination or CIE) are measured for the copper-mesh-layer-side surface before and after the test to obtain a color difference $\Delta E_{L^*a^*b^*}$. The total amount of acetic acid and formic acid extracted from the adhesive layer is more preferably 10 ng/cm² or less, still more preferably 3 ng/cm² or less. From the viewpoint of ensuring adhesion to the copper mesh layer, a certain total amount of acetic acid and formic acid may remain in the adhesive layer after the extraction. If the total amount of acetic acid and formic acid extracted from the adhesive layer in the above-mentioned test is 20 ng/cm² or less, 0.5 ng/cm² or more, or further, 1 ng/cm² or more of acetic acid and formic acid may be contained in the adhesive layer.

Extraction of the adhesive layer surface at 23° C. for 15 minutes with ultrapure water has to be performed in a clean booth disposed with a chemical filter. The elution amount (ng/cm²) of acetic acid or formic acid per unit area can be obtained by multiplying the concentration of acetic acid/forming acid in the resulting extract (ng/mL) by the amount of the resulting extract (mL) and then dividing the result by the extraction area (cm².) The total of the amounts obtained by the calculation is the total elution amount of acetic acid or formic acid.

As the acrylic ester and/or a methacrylic ester used to form a polymer having repeating units derived from an acrylic ester and/or a methacrylic ester, monomers such as (meth) acrylic acid alkyl ester, urethane (meth)acrylate obtained by the reaction of hydroxyl group-containing (meth)acrylic acid ester with isocyanates may be suitably used. Also, (meth)acrylic acid alkoxyalkyl ester or the like may be used. It should be noted acrylic acid and/or methacrylic acid is referred to herein as (meth)acrylic acid for brevity. Acrylate and/or methacrylate is referred to herein as (meth)acrylate.

Examples of the (meth)acrylic acid alkyl ester monomer used herein include methyl(meth)acrylate, ethyl(meth)acrylate, n-propyl(meth)acrylate, sec-propyl(meth)acrylate, n-butyl(meth)acrylate, sec-butyl(meth)acrylate, tert-butyl (meth)acrylate, isoamyl(meth) acrylate n-hexyl(meth) acrylate, cyclohexyl(meth)acrylate, n-octyl(meth)acrylate, isooctyl(meth)acrylate, 2-ethylhexyl(meth)acrylate, undecyl (meth)acrylate, and lauryl(meth)acrylate.

As the hydroxyl group-containing (meth) acrylic acid ester used for urethane (meth)acrylate obtained by the reaction of hydroxyl group-containing (meth)acrylic acid ester with isocyanates, 2-hydroxyethyl(meth)acrylate, 2-hydroxypropyl (meth)acrylate, and so on are suitably used. A compound having in the molecule thereof at least one isocyanate group may be used as the isocyanates, and divalent isocyanates such as tolylene diisocyanate, hexamethylene diisocyanate, isophorone diisocyanate, 4,4'-diphenylmethane diisocyanate, hydrogenated tolylene diisocyanate, hydrogenated 4,4'-diphenylmethane diisocyanate, lysine diisocyanate methyl ester, 2,2,4-trimethyl hexamethylene diisocyanate and xylylene diisocyanate are preferable. Multimers thereof (e.g. dimers or monomers) or adducts thereof may be used.

Preferable examples of urethane (meth)acrylate include urethane (meth)acrylate obtained by the reaction of 2-hydroxyethyl(meth)acrylate with tolylene diisocyanate and urethane (meth)acrylate obtained by the reaction of 2-hydroxypropyl(meth)acrylate with tolylene diisocyanate. Especially, urethane methacrylate obtained by the reaction of 2-hydroxyethyl methacrylate with tolylene diisocyanate is suitably used.

Examples of the (meth)acrylic acid alkoxyalkyl ester include 2-methoxyethyl(meth)acrylate, methoxyethyl(meth) acrylate, 2-methoxypropyl(meth)acrylate, 3-methoxypropyl (meth)acrylate, 2-methoxybutyl(meth)acrylate, 4-methoxybutyl(meth)acrylate, 2-ethoxyethyl(meth)acrylate, 3-ethoxypropyl(meth)acrylate and 4-ethoxybutyl(meth) acrylate.

Especially, the polymer having repeating units derived from an acrylic ester and/or a methacrylic ester used in the present invention preferably has repeating units derived from urethane (meth)acrylate as the repeating units derived from an acrylic ester and/or a methacrylic ester. In this case, it is more achievable that the amount of free organic acids in the adhesive layer is an amount that makes 10 or less the color difference $\Delta E_{L^*a^*b^*}$ of the copper-mesh-layer-side surface before and after the above-specified test in a high temperature and high humidity environment and the total amount of acetic acid and formic acid extracted by the above-specified test measures 20 ng/cm$^2$ or less, while the adhesive layer has appropriate adhesion properties that allow the adhesive layer to leave less adhesive residue behind and cause no partial peeling of a blackened layer and the like that are further laminated on the copper mesh layer of the electromagnetic wave shielding sheet, when the protective film is peeled off from the electromagnetic wave shielding sheet.

Preferable and concrete examples of the polymer having repeating units derived from an acrylic ester and/or a methacrylic ester used in the present invention include but are not limited to: (1) a copolymer having repeating units derived from urethane(meth)acrylate obtained by the reaction of 2-hydroxyethyl(meth)acrylate with tolylene diisocyanate and repeating units derived from methyl(meth) acrylate; (2) a copolymer having repeating units derived from urethane (meth) acrylate obtained by the reaction of 2-hydroxyethyl (meth) acrylate with tolylene diisocyanate, repeating units derived from butyl(meth) acrylate, repeating units derived from 2-ethylhexyl(meth) acrylate, and repeating units derived from ethyl(meth) acrylate; and (3) a copolymer having repeating units derived from urethane(meth)acrylate obtained by the reaction of 2-hydroxyethyl(meth) acrylate with tolylene diisocyanate and repeating units derived from ethyl(meth) acrylate.

Besides the above, the polymer having repeating units derived from an acrylic ester and/or a methacrylic ester used in the present invention may be copolymerized with a monomer having a functional group as far as the amount of contained free organic acids, the total amount of the extracted acetic acid and formic acid, and appropriate adhesion properties are not adversely affected. Example of monomers having a functional group include a monomer having a hydroxyl group such as 2-hydroxyethyl(meth)acrylate, 2-hydroxypropyl(meth)acrylate, and allyl alcohol; a monomer having an amide group such as (meth) acrylamide, N-methyl(meth) acrylamide, and N-ethyl(meth) acrylamide; a monomer having an amide group such as N-methylol (meth) acrylamide, and dimethylol (meth) acrylamide, and a methylol group; a monomer having a functional group such as a monomer having an amino group such as aminomethyl(meth) acrylate, dimethylaminoethyl(meth) acrylate, and vinylpyridine; a monomer having an epoxy group such as allyl glycidyl ether, and glycidyl ether (meth) acrylate Besides these monomers, fluorine-substituted (meth) acrylic acid alkyl ester, (meth) acrylonitrile, a vinyl group-containing aromatic compound such as styrene and methylstyrene, vinyl acetate, and a halogenated vinyl compound are included.

Besides the aforementioned monomers having a functional group, the acrylic adhesive used in the present invention may be copolymerized with other monomers having an ethylene double bond. Examples of the monomers having an ethylene double bond include α,β-unsaturated dibasic acid diesters such as dibutyl maleate, dioctyl maleate, and dibutyl fumarate; vinyl ether; a vinyl aromatic compound such as styrene, α-methylstyrene and vinyl toluene; and (meth) acrylonitrile.

Besides the aforementioned monomers having an ethylene double bond, a compound having two or more ethylene double bonds may be used in combination. Examples of such compounds include divinylbenzene, diallyl maleate, diallyl phthalate, ethylene glycol di(meth)acrylate, trimethylolpropane tri(meth)acrylate, methylene bis(meth) acrylamide.

In the polymer having repeating units derived from an acrylic ester and/or a methacrylic ester used for the adhesive layer of the present invention, the ratio of repeating units derived from one or two or more kinds of acrylic esters and/or methacrylic esters to the total number of repeating units of all monomers in a copolymer is preferably 50 mol % or more, more preferably 80 mol % or more, still more preferably 90 mol % or more. A copolymer comprising only repeating units derived from two or more kinds of acrylic esters and/or methacrylic esters is also suitably used.

As a commercial product of the resin film having an adhesive layer containing a polymer having repeating units derived from an acrylic ester and/or a methacrylic ester, for example, C-200 and C-300 (product name; manufactured by: Nitto Denko Corporation); A-1330 (product name; manufactured by: Hitachi Chemical Co., Ltd.) are suitably used.

The adhesive layer of the present invention may contain an antioxidant, a curing agent (a cross-linking agent) such as an isocyanate compound or the like, a tackifier, a silane coupling agent, a filler, and so on if required as far as the effects of the present invention can be obtained.

The thickness of the adhesive layer of the protective film of the present invention is not particularly limited as far as it is appropriately determined in order to appropriately control the adhesion properties of the adhesive layer with respect to the copper-mesh-layer-side surface of the electromagnetic wave shielding sheet. In general, the thickness of the adhesive layer is from 2 to 10 µm.

As a measure of the adhesion of the adhesive layer of the protective film of the present invention to the electromagnetic wave shielding sheet, the delamination resistance of the adhesive layer evaluated in the following manner is preferably from 0.05 to 1.3 N/25 mm. It is measured in such a manner that by means of a roller the adhesive layer of the protective film is allowed to adhere to non-mesh forming portion of a surface of an electrolytic copper foil having a thickness of 11 µm (product name: TC; manufactured by: Furukawa Circuit Foil Co., Ltd.), in which the surface has a "Rz JIS" (JIS B0601 (1994)) from 3 to 4.3 µm and a center line average roughness "Ra" (JIS B0601 (1994)) of fine irregularities on which part of the surface from 0.2 to 0.6 µm; the resulting sheet is cut to a size of 150 mm long by 25 mm wide; and the protective film was measured using a tensile testing machine such as "Tensilon" (product name; manufactured by: Toyo Seiki Seisakusho, Ltd.) by stretching the protective film and the electrolytic copper foil surface in a direction such that they make an angle of 180° at a pulling speed of 300 mm/min and in an environment of 20 to 25° C.

(Release Layer)

The protective film of the present invention may further have a release layer so that during storage the adhesive layer does not adhere to the support surface on which no adhesive layer is laminated and can be stored in rolled or stacked form. The release layer may be laminated on the support surface on which no adhesive layer is laminated. Moreover, the release layer may be laminated to the adhesive layer until the protective film for temporary lamination to an electromagnetic wave shielding sheet is actually and temporarily laminated to the electromagnetic wave shielding sheet. An easily peelable PET film subjected to a silicone treatment, for example, is suitably used as the release layer. An easily peelable paper may be the release layer that is laminated on the adhesive layer until the protective film for temporary lamination to an electromagnetic wave shielding sheet is actually and temporarily laminated to the electromagnetic wave shielding sheet.

(Method for Producing Protective Film)

The method for producing the protective film for temporary lamination to an electromagnetic wave shielding sheet of the present invention is a method for producing a protective film for temporary lamination to a copper-mesh-layer-side surface of an electromagnetic wave shielding sheet in which at least the copper mesh layer is provided on one surface of a transparent substrate, the method comprising the steps of: selecting an adhesive in which an amount of free organic acids is an amount that makes 10 or less a color difference $\Delta E_{L^*a^*b^*}$ of the copper-mesh-layer-side surface of the electromagnetic wave shielding sheet before and after the adhesive is laminated on the copper-mesh-layer-side surface and they are left for 200 hours in an atmosphere of a temperature of 60° C. and a relative humidity of 95%, from adhesives containing a polymer having repeating units derived from an acrylic ester and/or a methacrylic ester, and therewith forming an adhesive layer on a support.

Such a production method enables to produce a protective film that leaves no adhesive residue behind when peeled off and causes no partial peeling of a blackened layer and the like even in the case where the blackened layer and the like are further laminated on the copper mesh layer, while having appropriate adhesion properties that involves easy adhesion and easy peelability in a balanced manner with respect to a copper mesh layer of the electromagnetic wave shielding sheet; moreover, the protective film causes no discoloration of the electromagnetic wave shielding sheet even after long-term use, especially at high temperature and high humidity.

B. Electromagnetic Wave Shielding Sheet

Now, the electromagnetic wave shielding sheet of the present invention is described.

The first electromagnetic wave shielding sheet of the present invention is an electromagnetic wave shielding sheet comprising: a transparent substrate; at least a copper mesh layer provided on one surface of the transparent substrate; and a protective film temporarily laminated to a copper-mesh-layer-side surface, wherein the protective film comprises a support and an adhesive layer containing a polymer having repeating units derived from an acrylic ester and/or a methacrylic ester on the copper-mesh-layer-side surface of the support, and an amount of free organic acids in the adhesive layer is an amount that makes 10 or less a color difference $\Delta E_{L^*a^*b^*}$ of the copper-mesh-layer-side surface of the electromagnetic wave shielding sheet before and after the adhesive layer surface is laminated on the copper-mesh-layer-side surface and they are left for 200 hours in an atmosphere of a temperature of 60° C. and a relative humidity of 95%.

The second electromagnetic wave shielding sheet of the present invention is an electromagnetic wave shielding sheet comprising: a transparent substrate; at least a copper mesh layer provided on one surface of the transparent substrate; and a protective film temporarily laminated to a copper-mesh-layer-side surface, wherein the protective film comprises an adhesive layer containing a polymer having repeating units derived from an acrylic ester and/or a methacrylic ester; the protective film is temporarily laminated to the copper-mesh-layer-side surface through the adhesive layer; and 20 ng/cm$^2$ or less is a total amount of acetic acid and formic acid extracted upon testing the protective film by a test method in which the adhesive layer surface of the protective film is extracted at 23° C. for 15 minutes with ultrapure water and the resulting extract is measured for an amount of extracted acetic acid and an amount of extracted formic acid by ion chromatography.

The third electromagnetic wave shielding sheet of the present invention is an electromagnetic wave shielding sheet comprising: a transparent substrate; at least a copper mesh layer provided on one surface of a transparent substrate; and a protective film temporarily laminated to a copper-mesh-layer-side surface, wherein the protective film comprises an adhesive layer containing a polymer having repeating units derived from urethane acrylate and/or urethane methacrylate.

Temporarily laminating a temporary protective film to a copper mesh layer surface after forming the copper mesh layer surface on a transparent substrate by etching or plating has advantages such that during the time until the next process, the concave portion of the conductive mesh layer can be kept free of dust and the mesh lines can be free from contamination upon handling or storage. In the case of temporarily laminating a film having an adhesive layer to a copper mesh layer, however, some adhesives cause problems such that adhesive residue is left behind when a temporarily laminated protective film is peeled off and a blackened layer and the like are partially peeled off together with the protective film if the blackened layer and the like are further laminated on the copper mesh layer. Another problem is that the copper mesh layer discolors after the electromagnetic wave shielding sheet is stored for a long time, especially at high temperature and high humidity.

In this regard, according to the present invention, since the protective film uses an adhesive layer containing a polymer having repeating units derived from an acrylic ester and/or a methacrylic ester, especially a polymer having repeating units derived from urethane acrylate and/or urethane methacrylate for the adhesive to form an adhesive layer, the protective film leaves no adhesive residue behind when peeled off and causes no partial peeling of a blackened layer and the like that are further laminated on the copper mesh layer. In addition, the protective film has good adhesion and removability.

Further, since the amount of free organic acids in the adhesive layer of the protective film is an amount that makes 10 or less the color difference $\Delta E_{L^*a^*b^*}$ of the copper-mesh-layer-side surface before and after the above-specified test in a high temperature and high humidity environment, or since 20 ng/cm$^2$ or less is the total amount of acetic acid and formic acid extracted upon testing the protective film by the above-specified test method, an electromagnetic wave shielding sheet that does not discolor even after long-term use, especially at high temperature and high humidity, can be obtained.

It appears that due to the same reasons as in "A. Protective film for temporary lamination to electromagnetic wave shielding sheet," the protective film used in the present invention does not discolor even after long-term use, especially at high temperature and high humidity, while the copper mesh layer and the protective film exhibit appropriate adhesion properties.

(Layer Configuration)

Figure 2A:
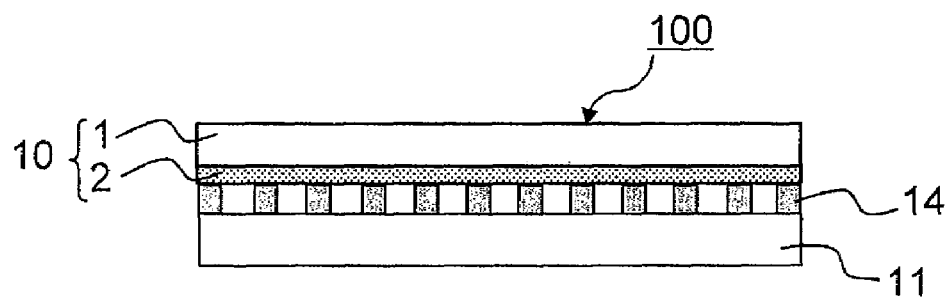
FIG. 2A is a sectional view illustrating an example of the electromagnetic wave shielding sheet according to the present invention.
Figure 2B:
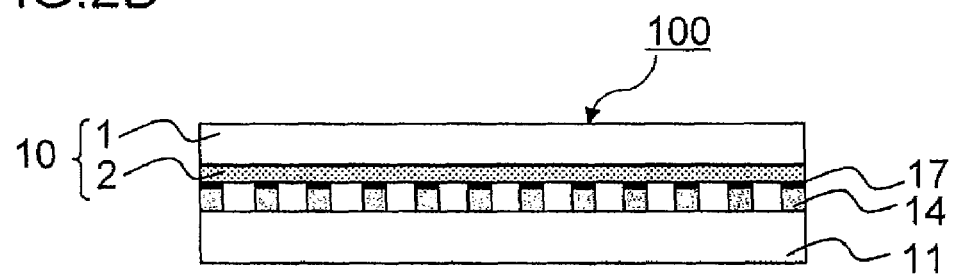
FIG. 2B is a sectional view illustrating an example of the electromagnetic wave shielding sheet according to the present invention.
Figure 2C:
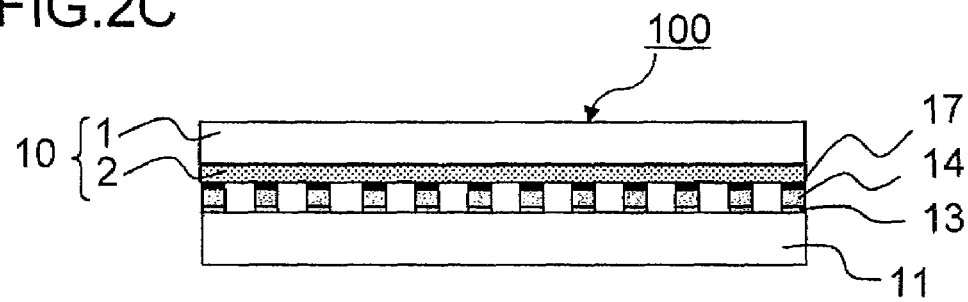
FIG. 2C is a sectional view illustrating an example of the electromagnetic wave shielding sheet according to the present invention.

FIGS. 2A to 2C are a sectional view of the electromagnetic wave shielding sheet of the present invention, showing an example of a basic embodiment.

FIG. 2A shows the configuration of an electromagnetic wave shielding sheet 100 in which a copper mesh layer 14 is formed on a transparent substrate 11 and a protective film 10 provided with an adhesive layer 2 and a support 1 is temporarily laminated to the copper mesh layer 14 surface through the adhesive layer 2.

An electromagnetic wave shielding sheet may be further provided with other layers. In the electromagnetic wave shielding sheet of the present invention, from the viewpoint of improving visibility of a display image by reducing light reflectance and enhancing contrast, a blackened layer 17 is preferably provided on the copper mesh layer 14 as shown in FIG. 2B.

In the configuration of FIGS. 2A and 2B, the copper mesh layer 14 may be laminated on the transparent substrate 11 through an adhesive layer (not shown.)

FIG. 2C shows an example of a layer configuration of an electromagnetic wave shielding sheet in the case where the electromagnetic wave shielding sheet is formed by an electrolytic plating method, in which configuration a conductive treating layer 13 is formed on the transparent substrate 11, the copper mesh layer 14 and the blackened layer 17 are further laminated thereon in this sequence, and the protective film 10 provided with the adhesive layer 2 and the support 1 is temporarily laminated to the blackened layer 17 surface through the adhesive layer 2.

Figure 3:
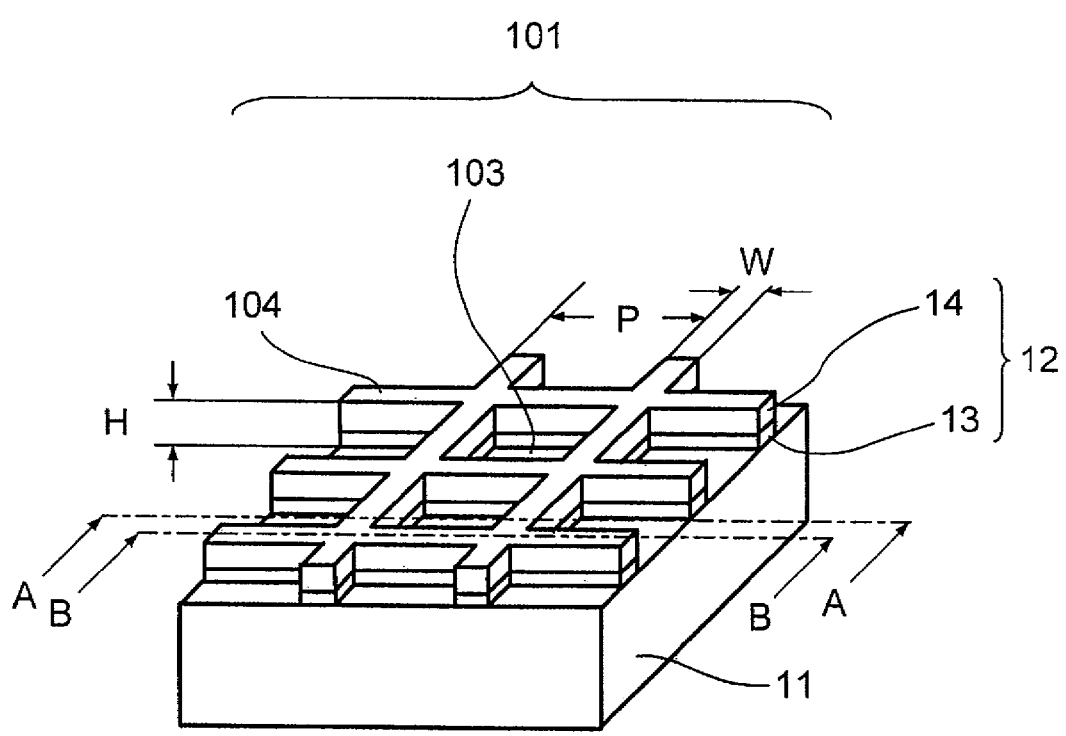
FIG. 3 is a perspective view of an example (FIG. 2C) of the electromagnetic wave shielding sheet according to the present invention.

FIG. 3 is a perspective view only showing the transparent substrate layer 11, the conductive treating layer 13 and the copper mesh layer 14 of the electromagnetic wave shielding sheet in FIG. 2C. The conductive treating layer 13 and the copper mesh layer 14 (hereinafter, the both layers and other conductive layers are correctively referred to as a "conductor layer 12") are in the form of a mesh with densely aligned openings 103. The mesh 101 consists of a combination of mesh lines 104 and openings 103. The blackened layer 17 (not shown) that is further laminated on the copper mesh layer 14 is incorporated with the conductor layer 12 to form the mesh 101.

Figure 4A:
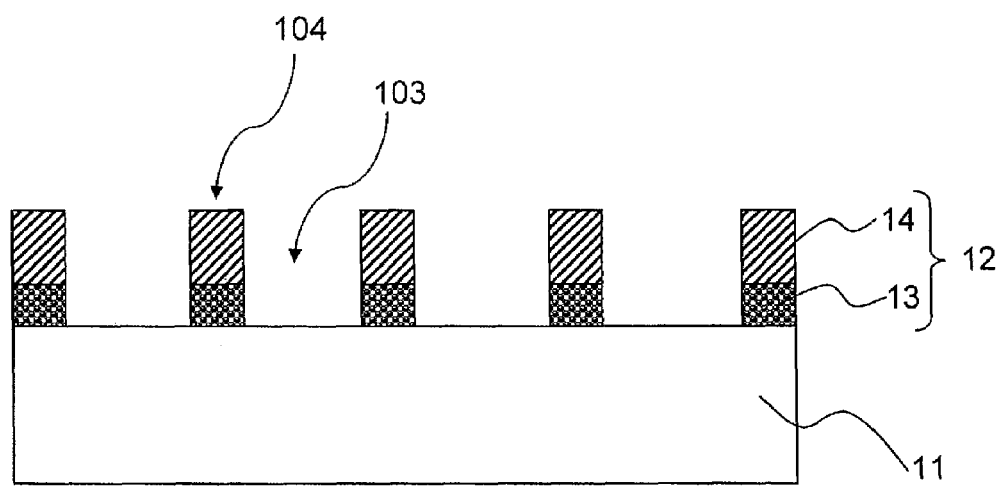
FIG. 4A is a sectional view taken along the line A-A of FIG. 3.
Figure 4B:
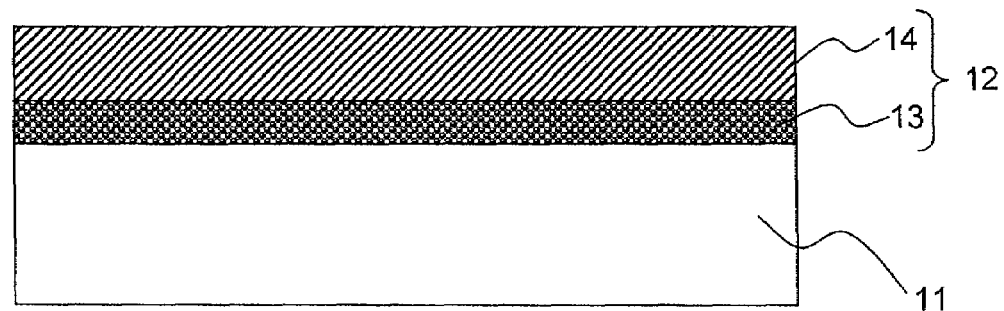
FIG. 4B is a sectional view taken along the line B-B of FIG. 3.

FIG. 4A is a sectional view taken along the line A-A of FIG. 3. FIG. 4B is a sectional view taken along the line B-B of FIG. 3. FIG. 4A shows a section of the openings, in which the openings 103 and the mesh lines 104 are formed alternately. FIG. 4B shows a section of the mesh line 104, in which the mesh line 104 comprising the copper mesh layer 14 and the conductive treating layer 13 is continuously formed. The sectional views of the electromagnetic wave shielding sheet of FIGS. 2A to 2C correspond to a sectional view taken along to the line A-A.

The embodiments of the electromagnetic wave shielding sheet of the present invention are not limited by the above-mentioned examples. As far as the protective film is laminated with its adhesive layer to the copper-mesh-layer-side surface of an electromagnetic wave shielding sheet, other protective films may be further laminated to the transparent substrate surface on which no copper mesh layer is laminated of the electromagnetic wave shielding sheet. The electromagnetic wave shielding sheet of the present invention may be in a form such that single- or multi-layered optical filters are preliminarily laminated to the transparent substrate surface on which no copper mesh layer is laminated of the electromagnetic wave shielding sheet. Examples of the optical filters include, for example, an antireflection layer, a near-infrared absorbing layer, and an anti-glare layer. Any that has the substantially same essential features as the technical ideas described in claims of the present invention and exerts the same effects and advantages is included in the technical scope of the present invention.

Hereinafter, layers of the electromagnetic wave shielding sheet of the present invention will be described, starting from a transparent substrate. The same protective film as the above-mentioned one of the present invention may be used for the protective film of the electromagnetic wave shielding sheet of the present invention. Thus, an explanation for the protective film of the electromagnetic wave shielding sheet of the present invention is omitted herein.

(Transparent Substrate)

A transparent substrate is a layer to reinforce a copper mesh layer with low mechanical strength. Accordingly, with appropriate consideration of heat resistance properties, insulation properties and so on, one with mechanical strength and optical transparency may be selected to use depending on the application. Specific Examples of the transparent substrate include, for example, a plate and a sheet (or film) made of organic material such as resin, and a plate made of inorganic material such as glass.

Examples of transparent resins used for the above-mentioned plate and sheet of organic material include, for example, polyester resins such as polyethylene terephthalate, polybutylene terephthalate, polyethylene naphthalate, a copolymer of terephthalic acid, isophthalic acid and ethylene glycol, a copolymer of terephthalic acid, cyclohexanedimethanol and ethylene glycol, polyamide resins such as such as nylon 6, polyolefin resins such as polypropylene and polymethylpentene, acrylic resins such as polymethylmethacrylate, styrene resins such as polystyrene, a copolymer of styrene and acrylonitrile, cellulose resin such as triacetyl cellulose, imide resins, and polycarbonate resins.

As a resin material, these resins are used solely or in combination (i.e. a mixed resin or a polymer alloy.) They are used as a single layer or a laminate composed of multiple layers. In the case where they are used as a resin sheet, they are preferably used as a uniaxially oriented sheet or a biaxially oriented sheet from the viewpoint of mechanical strength.

The resins may appropriately contain an additive such as an ultraviolet absorber, a filler, a plasticizer, an antistatic agent as needed.

Examples of the glass used for the above-mentioned glass plate include quartz glass, borosilicate glass, and soda-lime glass. Alkali-free glass or the like is more preferable, which has a low thermal expansion coefficient, is excellent in dimensional stability and workability at heat-treatment at an elevated temperature, and contains no alkaline component. A glass plate of such a glass may be used at the same time as an electrode substrate that will be used as a front substrate of a display.

The thickness of the transparent substrate is not particularly limited and may be determined according to the application. In the case of a transparent substrate made of a transparent resin, the thickness is generally from 12 to 1,000 µm, more preferably from 50 to 500 µm. If a transparent substrate is a glass plate, a glass plate having a thickness from 1 to 5 mm is generally preferable. Any of the materials having a thickness less than the range is insufficient in mechanical strength so as to cause warpage, loosening or breaking. Any of the materials having a thickness exceeding the range is excess in performance and expensive; moreover, thinning the electromagnetic wave shielding sheet becomes difficult.

The transparent substrate may be used as a front substrate that is a component of a display device comprising a front substrate and a back substrate. In the embodiment in which the electromagnetic wave shielding sheet is used as a front filter to be disposed in front of a front substrate, a sheet is more excellent than a plate in terms of thinness and lightness. In terms of durability, a resin sheet is more excellent than a glass plate.

For the above-mentioned reasons, a resin sheet is a preferred material for a transparent substrate. Among resin sheets, a polyester resin sheet of, for example, polyethylene terephthalate or polyethylene naphthalate is particularly preferable in terms of transparency, heat resistance, costs, and so on. Further, a biaxially oriented polyethylene terephthalate sheet is most preferable. Higher transparency is better for the transparent substrate, and an optical transparency having a visible light transmission of 80% or more is preferable.

A conventionally known adhesion-enhansing treatment such as a corona discharge treatment, a plasma treatment, an ozone treatment, a flame treatment, a primer treatment, a preheating treatment, a dust removal treatment, a vapor deposition treatment, and an alkali treatment may be appropriately performed on the surface of the transparent substrate.

(Copper Mesh Layer)

The copper mesh layer is a conductive layer that functions to shield electromagnetic waves. The copper mesh layer itself is non-transparent; however, it involves electromagnetic wave shielding properties and optical transparency in a balanced manner since it is in the form of a mesh and provided with openings.

A layer that is conductive and functions to shield electromagnetic waves may consist of a copper mesh layer only or a combination of a copper mesh layer and other layers of conductive materials. Examples of the other layers of conductive materials include, for example, a thin conductive layer which is to be used as a base layer for copper plating (hereinafter referred to as a conductive treating layer) and a conductive blackened layer, and they are collectively referred to as a conductor layer. In FIG. 2C, for example, if the blackened layer 17 is conductive, a conductor layer means the conductive treating layer 13, the copper mesh layer 14 and the blackened layer 17. If the blackened layer 17 is not conductive, a conductor layer means the conductive treating layer 13 and the copper mesh layer 14.

The copper mesh layer of the invention is a mesh layer containing copper. Examples of the copper mesh layer of the present invention include a mesh layer made of a copper alloy such as brass, bronze, phosphor bronze, cupronickel, and phosphorus-containing copper.

The conductor layer including the copper mesh layer may be any shape and there is no particular limit. The opening is typically square-shaped. The opening may be in a polygonal shape including a triangular shape such as an equilateral triangular shape, a quadrangular shape such as a square shape, a rectangular shape, a diamond shape, a trapezoidal shape, a hexagonal shape; or in a spherical shape or an ellipsoidal shape. The mesh has multiple openings in any of the above-mentioned shapes so as to be formed into a grid of lines between the openings, each of which lines generally has a uniform width. In general, the openings and the mesh lines of the entire copper mesh layer are the same in shape and size, respectively. More specifically, in consideration of the aperture ratio and the non-visibility of the mesh, the width of the mesh lines 104 between the openings (i.e., the line width "W") is preferably 40 µm or less, more preferably 20 µm or less. However, in order to exhibit the electromagnetic wave shielding effect and prevent breaking, it is preferable for the mesh lines to ensure a line width of at least 5 µm or more. The width of the openings can be represented by: (the line pitch "P")–(the line width "W"), and it is preferably 150 µm or more, more preferably 200 µm or more in the present invention in terms of optical transparency and that air bubbles hardly remain in the openings when laminated to an optical filter as will be described below. In order to exhibit the shielding effect of electromagnetic waves in the range of MHz to GHz, it has to be 3,000 µm at the maximum.

The height of the mesh lines 104 is approximately from 1 to 100 µm, preferably from 2 to 20 µm. If the thickness is far less than the range, the electrical resistance increases so that it becomes difficult to obtain a sufficient electromagnetic wave shielding performance. If the thickness exceeds the range, it becomes difficult to obtain a highly precise mesh pattern so that the uniformity of the mesh pattern decreases. The height of the mesh lines is the total thickness of, among the conductor layer 12 and non-conductive layers that are further laminated on the conductor layer 12, all layers which are provided with the openings and thus form the mesh lines 104. The bias angle of the mesh, which is an angle made by the meeting of the mesh lines of the mesh and the outer periphery of the electromagnetic wave shielding sheet, may be appropriately set at an angle that hardly produces moire patterns, in consideration of the pixel pitch or light emission properties of a display.

The method for forming the copper mesh layer is not particularly limited. Various conventionally known methods of forming an optically transparent electromagnetic wave shielding sheet may be appropriately employed, including the following four methods for example.

(1) A method in which a pattern is printed on a transparent substrate with an electric conductive ink, and a metal plating is applied on the electric conductive ink layer (see, for example, JP-A 2000-13088.)

(2) A method in which an electric conductive ink or a photosensitive coating liquid containing a catalyst for chemical plating is entirely applied on a transparent substrate, the applied layer is formed into a mesh by a photolithography method, and a metal plating is applied on the mesh (see, for example, "Photosensitive Catalyst for Electro-less Plating with Fine Pattern", Advanced Materials Research Group New Technology Research Laboratory Sumitomo Osaka Cement Co., Ltd., on Sumitomo Osaka Cement Co., Ltd. Web Page, http://www.socnb.com/product/hproduct/display.html, accessed on Jan. 7, 2003.)

(3) A transparent substrate is laminated to a metal foil with an adhesive, and then the metal foil is formed into a mesh by a photolithography method (see, for example, JP-A 11-145678.)

(4) A transparent substrate is prepared in which a metal thin film is formed by sputtering or the like on one surface of the transparent substrate to form a conductive treating layer and on the conductive treating layer a metal layer is formed by electrolytic plating as a metal plating layer. The metal plating layer of the metal plating transparent substrate and the conductive treating layer are formed to be mesh like by a photolithography method (see, for example, Japanese Patent No. 3502979, JP-A 2004-241761.)

(Blackened Layer)

In order to absorb outside light incident on the electromagnetic wave shielding sheet and improve the visibility of an image on a display, a blackened layer is preferably provided on the electromagnetic wave shielding sheet of the present invention in terms of enhancing contrast. Some blackened layer can increase adhesion due to its rough surface.

The blackened layer may be a layer which is in dark color such as black and satisfies the basic properties such as adhesion, and conventionally known blackened layers may be appropriately used. The blackened layer is not necessarily required to have conductivity.

Consequently, inorganic materials such as metal or organic materials such as black-colored resin may be used to form the blackened layer.

In the case of using inorganic materials, a metallic layer of a metal, an alloy, a metallic compound such as a metal oxide or metal sulfide is formed as the blackened layer. As a method for forming a metallic layer, various conventionally known blackening treatments may be appropriately used. Especially, blackening treatment by a plating method is preferably in terms of adhesiveness, uniformity, and simplicity. Materials used for plating include, for example, metals such as copper, cobalt, nickel, zinc, molybdenum, tin and chromium, and metallic compounds. Plating with these materials is more excellent than using cadmium or the like for plating in terms of adhesiveness, blackness and so on.

Materials including Black chromium, black nickel (nickel sulfide) and nickel alloys are preferably used to form the blackened layer. The nickel alloys include an alloy of nickel and zinc, an alloy of nickel and tin, and an alloy of nickel, tin and copper. In general, particles of the blackened layer are needle shaped so that they are easily deformed by external force and change their appearance. A blackened layer of a nickel alloy has advantages such that particles are hardly deformable and their appearance hardly changes in a post-process. In the case of using a blackened layer of nickel sulfide, there is an advantage of high productivity. In this case, however, there is a problem that discoloration of the blackened layer can easily occur due to an adhesive of the protective layer. The present invention can solve the problem. When a nickel alloy is used as the material of a blackened layer, the method for forming the blackened layer may be a conventionally known electrolytic or electroless plating. A nickel alloy may be formed after conducting a nickel plating.

Plating methods suitable as a blackening treatment include a cathodic electrodeposition plating method in which a conductor layer of copper is subjected to cathodic electrolysis in an electrolyte of such as sulfuric acid, copper sulfate, or cobalt sulfate, thereby depositing cationic particles on the conductor layer. According to this method, the cationic particles deposited on the conductor layer blacken the conductor layer and at the same time roughen the surface of the conductor layer. As the cationic particles, particles of copper or copper alloy may be used. As the particles of copper alloy, copper and cobalt alloy particles are preferable. The average particle diameter of the alloy particles is preferably from 0.1 to 1 μm. By using copper and cobalt alloy particles, a blackened layer comprising a copper-cobalt alloy particle layer can be obtained. The cathodic electrodeposition plating method is also preferable in terms that the average particle diameter of cationic particles to be deposited can be controlled from 0.1 to 1 μm. If the average particle diameter exceeds the range, the density of the deposited particles decreases. Thus, the blackness of the blackened layer decreases, becomes uneven, and detachment of the particles may easily occur. On the other hand, even if the average particle diameter is less than the range, the blackness of the blackened layer decreases. When conducting the cathodic electrodeposition at high current density, the surface of the copper mesh layer becomes cathodic and is activated by reducing hydrogen so that significantly improved adhesion can be obtained between the copper surface and the cationic particles.

The black density of the blackened layer is preferably 0.6 or more. Measurement of black density is carried out by means of COLOR CONTROL SYSTEM GRETAG SPM100-11 (product name; manufactured by: Kimoto Co., Ltd.) with an angle of observation field of 10° and observation light source D50. Illumination type is set to density standard ANSIT. A specimen is subject to measurement after white calibration. The light reflectance of the blackened layer is preferably 5% or less. Light reflectance is measured by means of Haze Meter HM150 (product name; manufactured by: Murakami Color Research Laboratory Co., Ltd.) in accordance with JIS-K7105, or it may be expressed by a reflectance value "Y" using a color-difference meter. In this case, "Y" is preferably 15 or less.

In the electromagnetic wave shielding sheet of the present invention, surface roughness of the copper-mesh-layer-side surface to which the protective film is temporarily laminated is preferably a ten-point average roughness "Rz JIS" (JIS B0601 (1994)) of the profile from 0.5 to 5.0 μm when a roughness profile is used as a profile of the surface, and a center line average roughness "Ra" (JIS B0601 (1994)) of fine irregularities on the surface from 0.1 to 3.0 μm from the viewpoint that the protective film can have adhesion and removability of the protective film when combined with an adhesive specified in the present invention, that is, the protective film leaves no adhesive residue behind when peeled off and causes no partial peeling of a blackened layer and the like if the blackened layer and the like are further laminated on the copper mesh layer.

(Lamination of Protective Film)

There is no particular limit to the method for temporarily laminating the above-mentioned protective film to a copper-mesh-layer-side surface of the electromagnetic wave shielding sheet in which at least the copper mesh layer is provided on one surface of a transparent substrate.

Any laminator such as a roll laminator or a flat bed laminator may be used as far as it can apply pressure to an optical filter and an electromagnetic wave shielding sheet. A roll laminator is preferable since it corresponds to roll to roll lamination method and enables continuous production.

Lamination pressure is not particularly limited. For example, in the case of using a roll laminator, a linear pressure from 1 to 20 kgf/cm is preferable. The temperature of a pressure member of a laminator is not particularly limited.

Figure 5:
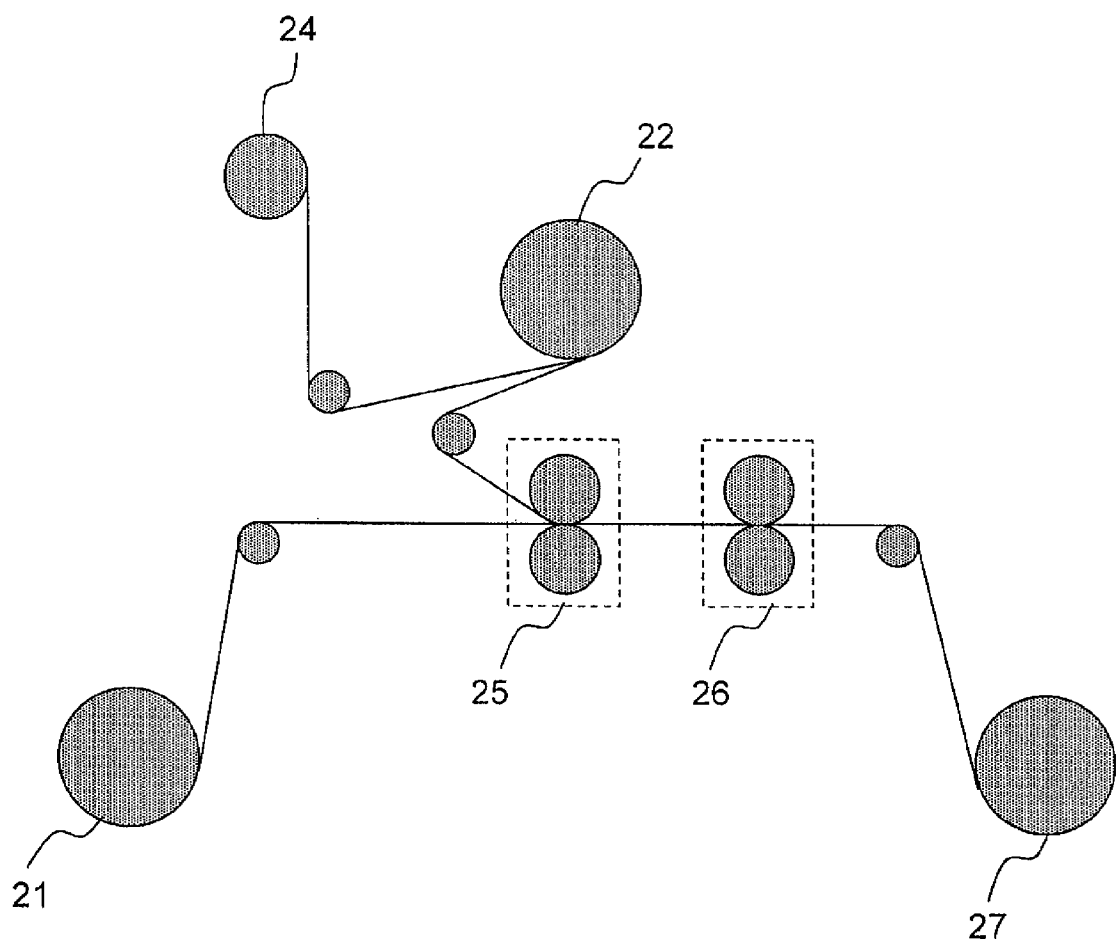
FIG. 5 is a diagram illustrating a laminating machine to temporarily laminate the electromagnetic wave shielding sheet and the protective film of the present invention.

FIG. 5 shows an example of a process for laminating an electromagnetic wave shielding sheet to a protective film by means of a laminator. A roll of an electromagnetic wave shielding sheet is set in a first paper feed member 21 of a laminator. A roll of a laminate sheet comprising a release film and a protective film (an adhesive layer and a support) is set in a second paper feed member 22. While the electromagnetic wave shielding sheet is fed from the first paper feed member 21, the laminate sheet is fed from the second paper feed member 22. At the same time, the release film is wound up onto a wind-up roller 24. A copper mesh layer side of the electromagnetic wave shielding sheet and the adhesive layer side of the protective film are faced to each other. They are laminated to each other by means of a first laminating unit 25 at a lamination pressure of approximately 10 kgf/cm, and then again by a second laminating unit 26 at a lamination pressure of approximately 10 kgf/cm. The lamination result is wound onto a wind-up roll 27, thus obtaining a laminate sheet comprising the electromagnetic wave shielding sheet and the protective film (the adhesive layer and the support.) Two laminating unit are used in FIG. 5; however, only one laminating unit may be used to laminate if it can provide a good lamination result.

The electromagnetic wave shielding sheet with the protective film of the present invention may be distributed in the form of a continuous band (roll) or separate sheets. There is no particular limit to the means for separating the sheet into separate sheets. Any kind of cutting means for filters may be used.

As described above, the protective film for temporary lamination to an electromagnetic wave shielding sheet of the present invention can provide an effect that the protective film leaves no adhesive residue behind when peeled off and causes no partial peeling of a blackened layer and the like even in the case where the blackened layer and the like are further laminated on the copper mesh layer, while having appropriate adhesion properties that involves easy adhesion and easy peelability in a balanced manner with respect to a copper mesh layer of the electromagnetic wave shielding sheet. Especially, if the amount of a specific acid in the adhesive layer is less than the specified amount, the protective film provides an additional effect that if causes no discoloration of the electromagnetic wave shielding sheet even after long-term use, especially at high temperature and high humidity.

The electromagnetic wave shielding sheet of the present invention is an electromagnetic wave shielding sheet with a protective film that is temporarily laminated on a copper mesh layer for shielding electromagnetic waves, which sheet provides an effect that the protective film leaves no adhesive residue behind when peeled off and causes no partial peeling of a blackened layer and the like even in the case where the blackened layer and the like are further laminated on the copper mesh layer, while the copper mesh layer and the protective film exhibit easy adhesion and easy peelability. Especially, if the amount of a specific acid in the adhesive layer of the protective film is less than the specified amount, the protective film provides an additional effect that if causes no discoloration of the copper mesh layer even after long-term use, especially at high temperature and high humidity.

The method for producing the protective film for temporary lamination to an electromagnetic wave shielding sheet of the present invention can provide effects that can obtain the protective film, in which the protective film leaves no adhesive residue behind when peeled off and causes no partial peeling of a blackened layer and the like even in the case where the blackened layer and the like are further laminated on the copper mesh layer, while having appropriate adhesion properties that involves easy adhesion and easy peelability in a balanced manner with respect to a copper mesh layer of the electromagnetic wave shielding sheet; moreover, the protective film causes no discoloration of the electromagnetic wave shielding sheet even after long-term use, especially at high temperature and high humidity.

The present invention is not limited by the above-mentioned embodiments. The above-mentioned embodiments are examples, and any that has the substantially same essential features as the technical ideas described in claims of the present invention and exerts the same effects and advantages is included in the technical scope of the present invention.

EXAMPLES

Hereinafter, the present invention will be explained further in detail with reference to examples. The scope of the present invention may not be limited to the following examples. Herein, "part(s)" refers to "part(s) by weight" if not particularly mentioned.

(Tests)

Each of the adhesive layer surfaces of the following protective films "A" to "D" was extracted at 23° C. for 15 minutes with ultrapure water. In particular, each protective film was cut into a size of 10 cm×10 cm and the adhesive layer of the cut out film was entirely immersed in 500 ml of ultrapure water and left at 23° C. for 15 minutes while.

The amounts of acetic acid and formic acid were measured for the resulting extract of each cut out film by ion chromatography. Said extraction was performed in a clean booth with a chemical filter. The elution amount ($ng/cm^2$) of each component per unit area was obtained by multiplying the concentration of acetic acid/forming acid in the resulting extract (ng/mL) by the amount of the resulting extract (mL) and then dividing the result by the extraction area ($cm^2$.)

Protective film A: An adhesive layer of the protective film A comprises an acrylic copolymer formed by copolymerizing urethane methacrylate, which is obtained by reaction of 2-hydroxyethyl methacrylate with tolylene diisocyanate, with methyl methacrylate. The thickness of the adhesive layer is 6 μm. The total thickness of the protective film A is 60 μm.

Protective film B: An adhesive layer of the protective film B comprises an acrylic copolymer formed by copolymerizing urethane methacrylate, which is obtained by reaction of 2-hydroxyethyl methacrylate with tolylene diisocyanate, with butyl acrylate, 2-ethylhexyl acrylate, and ethyl acrylate. The thickness of the adhesive layer is 6 μm. The total thickness of the protective film B is 60 μm.

Protective film C: An adhesive layer of the protective film C comprises an acrylic polymer formed by copolymerizing butyl acrylate with 2-ethylhexyl acrylate. The thickness of the adhesive layer is 6 μm. The total thickness of the protective film C is 60 μm.

Protective film D: An adhesive layer of the protective film D comprises a rubber copolymer comprising a styrene-isobutylene copolymer. The thickness of the adhesive layer is 6 μm. The total thickness of the protective film D is 60 μm.

Ion chromatography measurement condition was given as follows.

Apparatus: DX-600 (product name; manufactured by: Nippon Dionex K.K.)
Column: AG11-HC+AS11-HC
Eluent: KOH
Eluent concentration: 1 to 35 mM (Gradient)
(Test Results of the Amounts of Acetic Acid and Formic Acid)

Table 1 shows the amounts of acetic acid and formic acid obtained by the measurement. It is thus found that the protective film A and the protective film B could be used as the protective film for temporary lamination to an electromagnetic wave shielding sheet of the present invention.

TABLE 1

| Extracted Amount of Each Acid per Unit Area (ng/cm$^2$) | | |
|---|---|---|
|  | Acetic Acid | Formic Acid |
| Protective Film A | 1.2 | 0.7 |
| Protective Film B | 1.6 | 1.1 |
| Protective Film C | 86 | 16 |
| Protective Film D | Below detectable limit | Below detectable limit |

Example 1

An electromagnetic wave shielding sheet 100 shown in FIG. 2C was produced as follows.

As a transparent substrate 11, a colorless, transparent, biaxially-stretched polyethylene terephthalate film in the form of a continuous belt was prepared. The polyethylene terephthalate film had a thickness of 100 μm and a polyester resin primer layer on one surface thereof.

On the primer layer of the transparent substrate, a 0.1 μm thick nickel-chromium alloy layer and a 0.2 μm thick copper layer were provided in this sequence by a sputtering method so as to prepare a conductive treating layer 13.

Figure 6A:
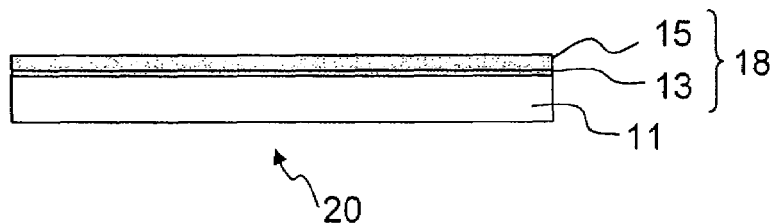
FIGS. 6A to 6D are diagrams illustrating an example of producing the electromagnetic wave shielding sheet according to the present invention.

On the conductive treating layer surface, a 2.0 μm thick copper plated layer 15 was provided by an electrolytic plating method using a copper sulfate bath (hereinafter, the conductive treating layer 13 and the copper plated layer are referred to as a metal layer 18 in combination.) As a result of forming the metal layer 18 on the transparent substrate, there was produced a copper-clad laminate sheet 20 as shown in FIG. 6A, in which the metal layer 18 was directly formed on the transparent substrate without an adhesive layer in between.

Figure 6B:
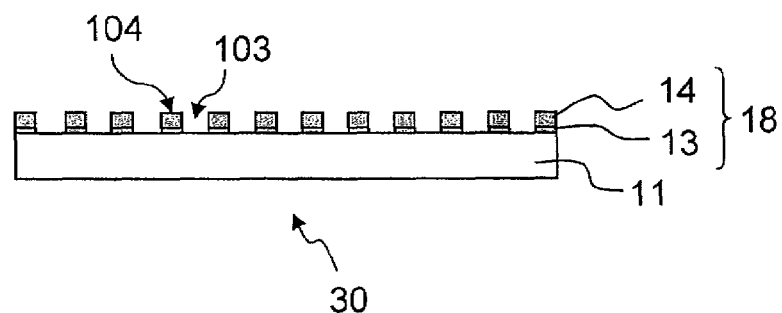

Next, the laminate sheet 20 was etched using the photo-lithographic method for the conductor layer 12 to form a mesh comprising openings 103 and mesh lines 104 as shown in FIG. 6B, thereby obtaining a laminate 30.

In etching, using a production line for a color TV shadow mask, a process from masking to etching was consistently performed on the continuous belt-shaped laminate sheet. A photosensitive etching resist was applied to the entire surface of the conductor layer surface of the laminate sheet and then a desired mesh pattern was transferred by contact exposure, followed by development, film-hardening treatment, and baking, so that the resist layer was patterned such that the resist layer remains on portions corresponding to mesh lines and no resist layer remains on portions corresponding to openings of the mesh. Next, the conductor layer was etched and removed in an aqueous ferric chloride to form mesh openings, followed by water washing, resist stripping, cleaning and drying in this sequence.

The mesh pattern of the mesh area had square openings and mesh lines having a line width of 10 μm, a line distance (pitch) of 300 μm, and a line height of 2.3 μm. When the mesh is cut in the form of a rectangular sheet, the bias angle, which is defined as an inferior angle to the long side of the rectangular sheet, is 49 degrees.

Figure 6C:
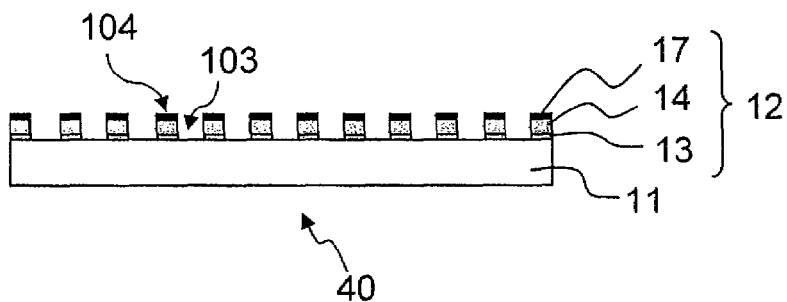

Next, a blackened layer 17 was formed on a metal layer 18 of the laminate 30. In particular, using a nickel plate as an anode, the laminate sheet in which the mesh-shaped conductor layer was formed on the transparent substrate was immersed in a plating bath of a mixture of a nickel ammonium sulfate solution, a zinc sulfate solution, and a sodium thiocyanate solution for a blackening treatment. The exposed surface of the conductor layer was entirely covered with the blackened layer 17 made of a nickel-zinc alloy, thus obtaining a laminate 40 as shown in FIG. 6C, in which the conductor layer 12 comprising the conductive treating layer 13, the copper mesh layer 14, and the blackened layer 17 was laminated.

Figure 6D:
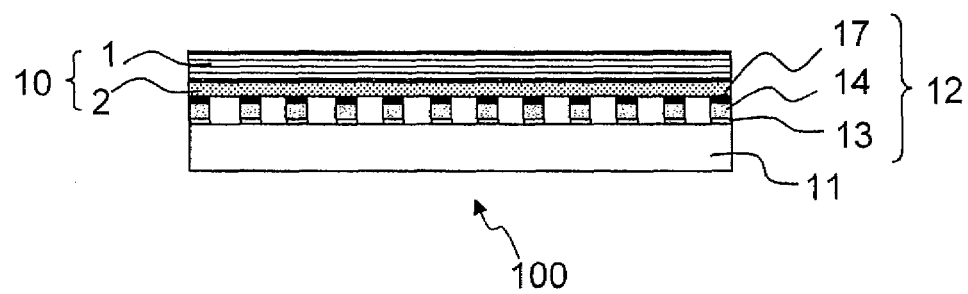

To the copper mesh side of the laminate 40, using a roll laminator, the protective film A in which an acrylic adhesive layer was laminated to a 50 μm thick polyethylene film support was laminated by pressing them between a pair of pressure rollers comprising a rubber coated steel core, at a roller pressure (total pressure) of 0.2 MPa and a processing speed of 15 meters per minute, thus producing an electromagnetic wave shielding sheet 100 of Example 1 as shown in FIG. 6D, having a structure comprising: the transparent substrate, the conductor layer 12 (comprising the conductive treating layer 13, the copper mesh layer 14, and the blackened layer 17,) and a protective film A 10 (comprising the adhesive layer 2 and a polyethylene film 1) in sequence.

Example 2

An electromagnetic wave shielding sheet was produced as in Example 1, except that the protective film A was changed to the protective film B.

Comparative Example 1

An electromagnetic wave shielding sheet was produced as in Example 1, except that the protective film A was changed to the protective film C.

Comparative Example 2

An electromagnetic wave shielding sheet was produced as in Example 1, except that the protective film A was changed to the protective film D.

(Evaluation)

Examples and Comparative Examples were evaluated on the following points. The results are shown in Table 2.

(1) Discoloration Property 1

Firstly, chromaticities a*, b*, and a luminance L* (defined by the International Commission on Illumination (CIE)) were measured for the copper mesh side surface of the electromagnetic wave shielding sheets of Examples and Comparative Examples. After the electromagnetic wave shielding sheets were exposed to an atmosphere of high temperature and high humidity (60° C., 95% RH) for 200 hours, chromaticities a*, b*, and a luminance L* were measured again for the copper mesh side surface of the electromagnetic wave shielding sheets. From results of the measurements, a color difference ΔE before and after exposed to an atmosphere of high temperature and high humidity was obtained. In Table 2, the marking "x" indicates $\Delta E_{L*a*b*}>10$ (i.e., the case where a color difference is above a narrow margin by visual examination and discoloration is clearly and visually observed.) The marking "Δ" indicates $1<\Delta E_{L*a*b*}\leq 10$ (i.e., the case where a color difference is below a narrow margin by visual examination.) The marking "o" indicates $\Delta E_{L*a*b*}\leq 1$ (i.e., the case where a color difference is below a differential threshold of discoloration by visual examination.)

(2) Discoloration Property 2

The electromagnetic wave shielding sheets were exposed to a dry atmosphere of high temperature (80° C.) for 200 hours to measure chromaticities a*, b*, and a luminance L* of the copper mesh side surface. From results of the measurements, a color difference $\Delta E_{L*a*b*}$ was obtained. The color difference $\Delta E_{L*a*b*}$ of the copper mesh side surface of each electromagnetic wave shielding sheet was evaluated in accordance with the standard mentioned in "(1) Discoloration property 1."

(3) Delamination Resistance (Adhesion)

Each electromagnetic wave shielding sheet to which each corresponding protective film was temporarily laminated was cut to a size of 150 mm long by 25 mm wide. The cut-off protective film was measured using a tensile tester (product name: Tensilon; manufactured by: Toyo Seiki Seisaku-sho, Ltd.) by stretching the protective film and the copper-mesh-layer-side surface in a direction such that they make an angle of 180° at a stretching speed of 300 mm/min and in an atmosphere of a temperature from 20 to 25° C.

(4) Adhesive Residue

In the evaluation of delamination resistance, it was visually determined if adhesive residue was left on the copper-mesh-layer-side surface or not when the protective film was peeled off. The marking "o" indicates that no adhesive was left on the copper-mesh-layer-side surface, and "x" indicates that adhesive was left on the copper-mesh-layer-side surface.

(5) Peeling of Blackened Layer

In the evaluation of delamination resistance, it was visually determined if partial peeling of the blackened layer occurred and the peeling adhered to the adhesive layer surface of the protective film when the protective film was peeled off. The marking "o" indicates no peeling of the blackened layer occurred, and "x" indicates that part of the blackened layer was peeled off and adhered to the adhesive layer surface.

TABLE 2

|  | Protective Film | Discoloration property 1 | Discoloration property 2 | Delamination Resistance (N/25 mm) | Adhesive Residue | Peeling of Blackened Layer |
|---|---|---|---|---|---|---|
| Example 1 | Protective Film A | o | o | 0.49 | o | o |
| Example 2 | Protective Film B | o | o | 1.1 | o | o |
| Comparative Example 1 | Protective Film C | x | x | 0.69 | o | o |
| Comparative Example 2 | Protective Film D | o | o | 0.12 | x | x |

(Results)

The above-described Examples and Comparative Examples result in the following findings.

The electromagnetic wave shielding sheets of Examples 1 and 2 are such that the protective film left no adhesive residue behind when peeled off and caused no partial peeling of a blackened layer and the like that were further laminated on the copper mesh layer, while the copper mesh layer and the protective film exhibited appropriate easy adhesion and easy peelability. Moreover, the electromagnetic wave shielding sheets did not discolor even after long-term use, especially at high temperature and high humidity.

On the other hand, the electromagnetic wave shielding sheet of Comparative Example 1, in which the amounts of acetic acid and formic acid extracted from the adhesive layer were large, had adequate adhesion properties; however, discoloration was observed after long-term storage, especially at high temperature and high humidity. In Comparative Example 2 using a rubber adhesive layer, discoloration of the copper mesh was not a problem and in a favorable state; however, the protective film left adhesive residue behind and caused partial peeling of the blackened layer when peeled off.

The invention claimed is:

1. An electromagnetic wave shielding sheet comprising:
a transparent substrate,
at least a copper mesh layer provided on one surface of the transparent substrate, and
a protective film temporarily laminated to a copper-mesh-layer-side surface,
wherein the protective film comprises a support and an adhesive layer containing a polymer having repeating units derived from urethane acrylate and/or urethane methacrylate on the copper mesh layer side of the support.

2. The electromagnetic wave shielding sheet according to claim 1, wherein delamination resistance of the adhesive layer of the protective film is from 0.05 to 1.3 N/25 mm with respect to the copper-mesh-layer-side surface.

3. The electromagnetic wave shielding sheet according to claim 1, wherein surface roughness of the copper-mesh-layer-side surface to which the protective film is temporarily laminated is, when a roughness profile is used as a profile of the surface, a ten-point average roughness "Rz JIS" (JIS B0601 (1994)) of the profile from 0.5 to 5.0 μm.

4. The electromagnetic wave shielding sheet according to claim 1, wherein surface roughness of the copper-mesh-layer-side surface to which the protective film is temporarily laminated is a center line average roughness "Ra" (JIS B0601 (1994)) of fine irregularities on the surface from 0.1 to 3.0 μm.

5. An electromagnetic wave shielding sheet comprising:
a transparent substrate,
at least a copper mesh layer provided on one surface of the transparent substrate, and
a protective film temporarily laminated to a copper-mesh-layer-side surface,
wherein the protective film comprises a support and an adhesive layer containing a polymer having repeating units derived from an acrylic ester and/or a methacrylic ester on the support;
wherein the repeating units derived from the acrylic ester and/or the methacrylic ester in the adhesive layer of the protective film comprise repeating units derived from urethane acrylate and/or urethane methacrylate;

wherein the protective film is temporarily laminated to the copper-mesh-layer-side-surface through the adhesive layer; and wherein 20 ng/cm$^2$ or less is a total amount of acetic acid and formic acid present on the adhesive layer surface of the protective film.

6. The electromagnetic wave shielding sheet according to claim 5, wherein delamination resistance of the adhesive layer of the protective film is from 0.05 to 1.3 N/25 mm with respect to the copper-mesh-layer-side surface.

7. The electromagnetic wave shielding sheet according to claim 5, wherein surface roughness of the copper-mesh-layer-side surface to which the protective film is temporarily laminated is, when a roughness profile is used as a profile of the surface, a ten-point average roughness "Rz JIS" (MS B0601 (1994)) of the profile from 0.5 to 5.0 µm.

8. The electromagnetic wave shielding sheet according to claim 5, wherein surface roughness of the copper-mesh-layer-side surface to which the protective film is temporarily laminated is a center line average roughness "Ra" (JIS B0601 (1994)) of fine irregularities on the surface from 0.1 to 3.0 µm.

9. An electromagnetic wave shielding sheet comprising:
a transparent substrate,
at least a copper mesh layer provided on one surface of the transparent substrate, and
a protective film temporarily laminated to a copper-mesh-layer-side surface,
wherein the protective film comprises a support and an adhesive layer containing a polymer having repeating units derived from an acrylic ester and/or a methacrylic ester on the copper mesh layer side of the support;

wherein the repeating units derived from the acrylic ester and/or the methacrylic ester in the adhesive layer of the protective film comprise repeating units derived from urethane acrylate and/or urethane methacrylate:

wherein an amount of free organic acids in the adhesive layer is an amount that satisfies the equation $\Delta E_{L^*a^*b^*} \leq 10$; and wherein $\Delta E_{L^*a^*b^*}$ represents a color difference of the copper-mesh-layer-side surface of the adhesive layer before and after the adhesive layer surface is laminated on the copper-mesh-layer-side surface of the electromagnetic wave shielding sheet and left for 200 hours in an atmosphere of a temperature of 60° C. and a relative humidity of 95%.

10. The electromagnetic wave shielding sheet according to claim 1, wherein delamination resistance of the adhesive layer of the protective film is from 0.05 to 1.3 N/25 mm with respect to the copper-mesh-layer side surface.

11. The electromagnetic wave shielding sheet according to claim 1, wherein surface roughness of the copper-mesh-layer-side surface to which the protective film is temporarily laminated is, when a roughness profile is used as a profile of the surface, a ten-point average roughness "Rz JIS" (JIS B0601 (1994)) of the profile from 0.5 to 5.0 µm.

12. The electromagnetic wave shielding sheet according to claim 1, wherein surface roughness of the copper-mesh-layer-side surface to which the protective film is temporarily laminated is a center line average roughness "Ra" (JIS B0601 (1994)) of fine irregularities on the surface from 0.1 to 3.0 µm.

* * * * *